US011658662B2

(12) United States Patent
Akamatsu et al.

(10) Patent No.: US 11,658,662 B2
(45) **Date of Patent: *May 23, 2023**

(54) LEAKAGE CURRENT REDUCTION IN ELECTRONIC DEVICES

(71) Applicant: Micron Technology, inc., Boise, ID (US)

(72) Inventors: Hiroshi Akamatsu, Boise, ID (US); Ki-Jun Nam, Boise, ID (US); John David Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

This patent is subject to a terminal disclaimer.

(21) Appl. No.: 17/078,965

(22) Filed: Oct. 23, 2020

(65) Prior Publication Data

US 2021/0044296 A1 Feb. 11, 2021

Related U.S. Application Data

(63) Continuation of application No. 16/205,953, filed on Nov. 30, 2018, now Pat. No. 10,848,153.

(51) Int. Cl.
*H03K 19/00* (2006.01)
*H03K 19/096* (2006.01)

(52) U.S. Cl.
CPC ..... *H03K 19/0016* (2013.01); *H03K 19/0963* (2013.01)

(58) Field of Classification Search
CPC . H03K 19/0016; H03K 19/0963; G11C 5/147
See application file for complete search history.

(56) References Cited

U.S. PATENT DOCUMENTS 5,073,723 A 12/1991 Da Costa
5,811,992 A 9/1998 D'Souza
(Continued)

FOREIGN PATENT DOCUMENTS

CN 102214483 A 10/2011
CN 103092239 A 5/2013

OTHER PUBLICATIONS

China National Intellectual Property Administration, "First Office Action," issued in connection with Chinese Patent Application No. 201911193365.X, dated Feb. 26, 2021 (9 pages with translation).

*Primary Examiner* — Daniel D Chang
(74) *Attorney, Agent, or Firm* — Holland & Hart LLP

(57) ABSTRACT

Methods, systems, and devices for leakage current reduction in electronic devices are described. Electronic devices may be susceptible to leakage currents when operating in a first mode, such as an inactive (e.g., a standby) mode. To mitigate leakage current, an electronic device may include transistors coupled in cascode configuration where a gate of a drain-side transistor in the cascode configuration is configured to be biased by an adjustable (e.g., a dynamic) control signal. When the transistors are inactive (e.g., "off"), the control signal may be adjusted to prevent leakage associated with the inactive transistors. Further, a source-side transistor in the cascode configuration may be configured to have a high threshold voltage (e.g., relative to the drain-side transistor).

17 Claims, 9 Drawing Sheets

(56) References Cited

U.S. PATENT DOCUMENTS

| | | | | |
|---|---|---|---|---|
| 5,903,169 | A * | 5/1999 | Kong | H03K 19/215 326/121 |
| 6,133,762 | A | 10/2000 | Hill et al. | |
| 7,394,300 | B2 | 7/2008 | Chae | |
| 2007/0176633 | A1* | 8/2007 | Kawabe | H03K 19/00361 326/58 |
| 2007/0274124 | A1* | 11/2007 | Otsuka | G11C 11/417 365/154 |
| 2009/0086517 | A1 | 4/2009 | Wei et al. | |
| 2010/0049901 | A1* | 2/2010 | Chiou | G06F 8/65 711/E12.001 |
| 2012/0099360 | A1* | 4/2012 | Takemura | G11C 11/412 365/72 |
| 2012/0268212 | A1 | 10/2012 | Christen | |
| 2013/0083588 | A1* | 4/2013 | Takemura | G11C 11/413 365/149 |
| 2015/0256177 | A1* | 9/2015 | Kozu | H01L 29/42384 361/679.01 |
| 2016/0011620 | A1 | 1/2016 | Kim | |
| 2017/0149423 | A1* | 5/2017 | Huang | G01R 31/2621 |

* cited by examiner

| | First Configuration 405 | Second Configuration 410 | Third Configuration 415 | Fourth Configuration 420 |
|---|---|---|---|---|
| Transistor 320 | HIGH $V_{TH}$ | LOW $V_{TH}$ | HIGH $V_{TH}$ | LOW $V_{TH}$ |
| Transistor 325 | HIGH $V_{TH}$ | HIGH $V_{TH}$ | LOW $V_{TH}$ | HIGH $V_{TH}$ |
| Transistor 330 | LOW $V_{TH}$ | LOW $V_{TH}$ | LOW $V_{TH}$ | LOW $V_{TH}$ |
| Transistor 360 | HIGH $V_{TH}$ | HIGH $V_{TH}$ | HIGH $V_{TH}$ | LOW $V_{TH}$ |
| Transistor 365 | LOW $V_{TH}$ | LOW $V_{TH}$ | LOW $V_{TH}$ | LOW $V_{TH}$ |
| Transistor 370 | HIGH $V_{TH}$ | LOW $V_{TH}$ | LOW $V_{TH}$ | HIGH $V_{TH}$ |
| Transistor 375 | LOW $V_{TH}$ | LOW $V_{TH}$ | LOW $V_{TH}$ | LOW $V_{TH}$ |

LEAKAGE CURRENT REDUCTION IN ELECTRONIC DEVICES

CROSS REFERENCE

The present Application for Patent is a continuation of U.S. patent application Ser. No. 16/205,953 by Akamatsu, et al., entitled "LEAKAGE CURRENT REDUCTION IN ELECTRONIC DEVICES" filed Nov. 30, 2018, assigned to the assignee hereof, and is expressly incorporated by reference in its entirety herein.

BACKGROUND

The following relates generally to leakage current reduction and more specifically to leakage current reduction for transistors.

In an electrical device (e.g., an integrated circuit), leakage current may result in undesired power consumption when the device is in a standby state, which may also be referred to as an inactive, idle, or off state. For example, a transistor may conduct a non-zero amount of leakage current even when the transistor is configured to be in an off (e.g., cutoff) state. A number of such transistors in an electrical device may each contribute to an overall amount of leakage current and thus to an overall amount of power consumption by the electrical device when the electrical device is in a standby state.

Memory devices are one example of a type of device that may utilize one or more transistors. Memory devices are widely used to store information in various electronic devices such as computers, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device. A memory device may use an inverter to receive a signal having a first logic state (e.g., a logic "0") and output a signal having a second logic state (e.g., a logic "1").

Improved solutions for reducing leakage current associated with transistors—whether included within a memory device or another type of electronic devices and/or systems—are desired.

BRIEF DESCRIPTION OF THE DRAWINGS

FIG. 4 illustrates an example of table depicting example transistor types implemented in a circuit that supports leakage current reduction in electronic devices in accordance with aspects of the present disclosure.

DETAILED DESCRIPTION

Figure 1:
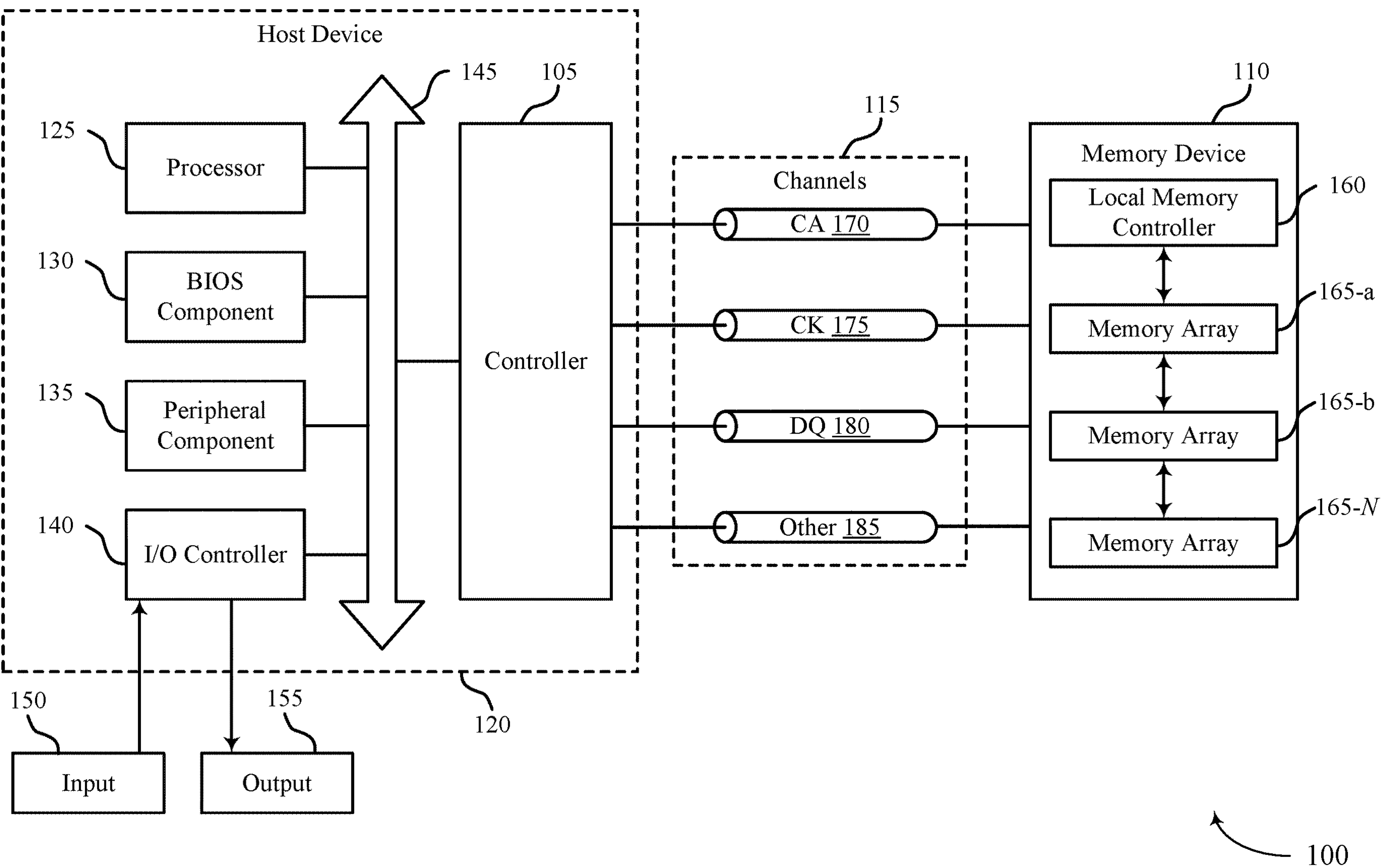
FIG. 1 illustrates an example of a memory array that supports leakage current reduction in electronic devices in accordance with examples of the present disclosure.

A transistor may be conceptualized in some cases as a perfect switch, meaning as an open circuit with infinite resistance when in an "off" state (e.g., when biased in cutoff mode) and as a short circuit with zero resistance when in an "on" state (e.g., when biased in saturation mode). A transistor as actually implemented in an electronic device (e.g., in an integrated circuit), however, may not be ideal and thus may allow some current to flow even when nominally in the off state and exhibit a non-zero resistance when in the on state. Current that flows through a transistor when the transistor is in the off state may be referred to as leakage current and may result in a corresponding amount of undesired power consumption, among other adverse conditions.

Some transistors (e.g., metal-oxide-semiconductor field effect transistors (MOSFETs) may exhibit a type of leakage current referred to as gate-induced drain leakage (GIDL). The gate and drain of a transistor may overlap spatially within the transistor, and amplification of charge in the overlapped region may give rise to GIDL. Accordingly, the magnitude or amount of GIDL may be proportional to the difference in voltage between the drain and gate of the transistor. For example, in an NMOS transistor, GIDL may occur when the drain of the transistor is at a higher voltage than the gate of the transistor, and GIDL may increase when the difference between the voltage at the drain and the voltage at the gate increases. Conversely, in a PMOS transistor, GIDL may occur when the gate of the transistor is at a higher voltage than the drain of the transistor, and GIDL may increase when the difference between the voltage at the gate and the voltage at the drain increases.

Additionally or alternatively, some transistors (e.g., metal-oxide-semiconductor field effect transistors (MOSFETs) may exhibit a type of leakage current referred to as subthreshold leakage (ISUB). ISUB may generally refer to leakage current that occurs when the difference between the voltage of the gate of a transistor and the voltage of the source of the transistor (gate-source voltage) is below the threshold voltage (Vth) of the transistor. As the magnitudes of supply voltages in electronic devices are reduced, the threshold voltages of transistors may be correspondingly reduced. And as the threshold voltage of a transistor is reduced, the difference between a gate-source voltage associated with the transistor being on versus the gate-source voltage associated with the transistor being off may be correspondingly reduced, such that a reduced threshold voltage may correspond to a reduced (weakened) ability to fully "turn off" the transistor. An amount or magnitude of ISUB may be inversely proportion to Vth, and a transistor with a high Vth may exhibit reduced ISUB relative to a transistor with a low Vth. Further, ISUB may flow from the drain to the source of a transistor and therefore may also be proportional to the difference in voltage between the drain and source of the transistor, such that reducing the difference in voltage between the drain and source of the transistor may reduce ISUB.

GIDL, ISUB, and other forms of leakage current may be undesirable as they may result in increased power consumption and otherwise diminish overall performance of an electronic device. Techniques described herein may beneficially reduce leakage current—such as GIDL and ISUB—in an electronic device, including for transistors configured to be an off state when the device is in a standby mode.

For example, in some cases, a single transistor in an electronic device may be replaced by two transistors in a cascode arrangement. Further, in some cases, at least one transistor having a relatively high Vth (e.g., as compared to one or more other transistors in an electronic device) may be utilized in the cascode arrangement.

For example, in a cascode of two transistors, a first transistor may have its source coupled with the drain of a second transistor, and the source of the second transistor may function as a source for the cascode arrangement while the drain of the first transistor may function as a drain for the cascode arrangement. Thus, the first transistor may be referred to as the drain-side transistor of the cascode arrangement while the second transistor may be referred to as the source-side transistor of the cascode arrangement. In some cases, the source-side transistor may have a relatively high Vth (e.g., as compared to one or more other transistors in the electronic device, including possibly as compared to the drain-side transistor), which may beneficially reduce leakage current (e.g., ISUB) through the cascode arrangement. Some examples may forgo a cascode arrangement for a transistor configured to be on during a standby mode, and a cascode arrangement in which at least the source-side transistor has a relatively high Vth may be utilized where the source-side transistor is configured to be off during the standby mode.

Additionally or alternatively, the drain-side transistor in a cascode arrangement may have a gate configured to be biased by a dynamic (e.g., variable, adjustable, switchable) control signal (which may also be referred to as a dynamic bias voltage). Thus, the gate of the drain side transistor may be biased at a first voltage when the electronic device is an active or on mode and may be biased at a second voltage when the electronic device is in the standby mode.

During the active mode, the voltage of the dynamic control signal may be configured to be equal to an upper supply voltage (e.g., a positive voltage) or a lower supply voltage (e.g., a negative voltage or a ground reference). Thus, during the active mode, in some cases the voltage of the dynamic control signal may be at a rail voltage. During the standby mode, the voltage of the dynamic control signal may be changed to be between the upper supply voltage and the lower supply voltage, which may—relative to voltage of the dynamic control signal during the active mode—reduce the drain voltage of an NMOS source-side transistor or increase the drain voltage of a PMOS source-side transistor and thereby reduce leakage current through the source-side transistor (e.g., GIDL and ISUB). Thus, a voltage swing of the dynamic control signal may be less than a difference between the upper supply voltage and lower supply voltage (e.g., may be less than a rail-to-rail voltage for the electronic device or for the cascode arrangement).

Features of the disclosure are initially described in the context of a memory system. Features of the disclosure are described in the context of example circuits, a timing diagram, and a device diagram in accordance with aspects of the present disclosure. These and other features of the disclosure are further illustrated by and described with reference to apparatus diagrams, system diagrams, and flowcharts that relate to leakage current reduction in electronic devices. In some cases, aspects of the techniques described herein are illustrated and described in the context of one or more inverters, but it is to be understood that the techniques described herein may be utilized in and applied to any electronic circuit in which reduced leakage current through one or more transistors is desired, including, but not limited to, logic gates other than inverters. Similarly, in some cases, aspects of the techniques described herein are illustrated and described in the context of a memory device, but it is to be understood that the techniques described herein may be utilized in and applied to any electronic device in which reduced leakage current through one or more transistors is desired.

FIG. 1 illustrates an example of a system 100 that utilizes one or more memory devices in accordance with various examples of the present disclosure. The system 100 may include a controller 105, a memory device 110, and a plurality of channels 115 coupling the controller 105 with the memory device 110. The system 100 may include one or more memory devices, but for ease of description the one or more memory devices may be described as a single memory device.

The system 100 may be an example of an electronic device, such as a computing device, a mobile computing device, a wireless device, a portable electronic device, a graphics processing device, a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be an example of a host device 120. The host device 120 may be an example of a component or device that is coupled with the memory device 110 and that uses memory to execute processes related to the operation of the host device 120. In some cases, the host device 120 may refer to the hardware, firmware, software, or a combination thereof that implements the functions of the controller 105.

In some cases, a memory device 110 may be an independent device or component that is configured to communicate with other components of the system 100 and provide physical memory addresses/space to be used or referenced by the system 100. In some examples, a memory device 110 may be configured to interface with at least one or a plurality of different types of systems. Signaling between the components of the system 100 and the memory device 110 may support modulation schemes to modulate the signals, pin designs for communicating the signals, distinct packaging of the system 100 and the memory device 110, clocking and synchronization between the system 100 and the memory device 110, timing conventions, and/or other factors.

The memory device 110 may be configured to store data for the components of the system 100. In some cases, the memory device 110 may act as a slave-type device to the controller 105 (e.g., responding to and executing commands provided by other components of the system 100 through the controller 105). Such commands may include an access command for an access operation, such as a write command for a write operation, a read command for a read operation, a refresh command for a refresh operation, or other commands.

The system 100 may further include a processor 125, a basic input/output system (BIOS) component 130, one or more peripheral components 135, and an input/output (I/O) controller 140. The components of system 100 may be in electronic communication with one another using a bus 145.

The processor 125 may be configured to control at least portions of the system 100. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 125 may be an example of a central processing unit (CPU), a graphics processing unit (GPU), or a system on a chip (SoC), among other examples.

The BIOS component 130 may be a firmware or software component that may initialize and run various hardware components of the system 100. The BIOS component 130 may manage data flow between the processor 125 and the various components of the system 100, e.g., the peripheral components 135, the I/O controller 140, etc. The BIOS component 130 may include a program or software stored in ROM, flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component (s) 130 may be other components understood by those skilled in the art as peripherals.

The I/O controller 140 may manage data communication between the processor 125 and the peripheral component(s) 135, input devices 150, or output devices 155. The I/O controller 140 may manage peripherals that are not integrated into or with the system 100. In some cases, the I/O controller 140 may represent a physical connection or port to external peripheral components.

The input 150 may represent a device or signal external to the system 100 that provides information, signals, or data to the system 100 or its components. This may include a user interface or interface with or between other devices. In some cases, the input 150 may be a peripheral that interfaces with system 100 via one or more of the peripheral components 135 or may be managed by the I/O controller 140.

The output device 155 may represent a device or signal external to the system 100 configured to receive an output from the system 100 or any of its components. Examples of the output device 155 may include a display, audio speakers, a printing device, or another processor on printed circuit board, etc. In some cases, the output device 155 may be a peripheral that interfaces with the system 100 via one or more of the peripheral components 135 or may be managed by the I/O controller 140.

The components of system 100 may be made up of general-purpose or special-purpose circuitry designed to carry out their functions. This may include various circuit elements, for example, conductive lines, transistors, capacitors, inductors, resistors, amplifiers, or other active or passive elements, configured to carry out the functions described herein. In some cases, one or more transistors in system 100 may be configured to have a high Vth relative to one or more other transistors in system 100. In some cases, one or more transistors in system 100 may be configured in a cascode arrangement, and the source-side transistor may have a high Vth relative to one or more other transistors in system 100 (e.g., relative to the drain-side transistor in the cascode arrangement). Additionally or alternatively, in some cases, the gate of the drain-side transistor of the cascode arrangement may be configured to be biased by a dynamic control signal, which may be configured to reduce the magnitude of a drain-to-gate and drain-to-source voltage differential for the drain-side transistor when the component of system 100 that includes the cascode arrangement is in standby mode. In some cases, the dynamic control signal may be generated or provided by, or its voltage controlled by, a controller (e.g., a memory controller) included in system 100.

The memory device 110 may include a local memory controller 160 and one or more memory arrays 165 (e.g., memory array 165-*a*, memory array 165-*b*, and/or memory array 165-N). A memory array 165 may be a collection of memory cells, with each memory cell being configured to store at least one bit of digital data. Features of memory arrays 165 and/or memory cells are described in more detail with reference to FIG. 2.

The local memory controller 160 may include circuits or components configured to control operation of the memory device 110. As such, the local memory controller 160 may be configured to receive, transmit, or execute commands, data, or control information related to the memory device 110. The local memory controller 160 may be configured to communicate with the controller 105, the one or more memory arrays 165, or the processor 125. In some cases, the memory device 110 may receive data and/or commands from the controller 105. For example, the memory device 110 may receive a write command indicating that the memory device 110 is to store certain data on behalf of a component of the system 100 (e.g., the processor 125). The local memory controller 160 comprises the hardware, firmware, and software that enables the memory device 110 to perform commands or access operations (e.g., write or read). Examples of the components included in the local memory controller 160 may include receivers for demodulating signals received from the controller 105, decoders for modulating and transmitting signals to the controller 105, logic, decoders, amplifiers, filters, or the like.

The controller 105 may be configured to enable communication of information, data, and/or commands between components of the system 100 (e.g., the processor 125) and the memory device 110. The controller 105 may act as a liaison between the components of the system 100 and the memory device 110 so that the components of the system 100 may not need to know the details of the memory device's operation. The components of the system 100 may present requests to the controller 105 (e.g., read commands or write commands) that the controller 105 satisfies. The controller 105 may convert or translate communications exchanged between the components of the system 100 and the memory device 110.

In some cases, the controller 105 or other component of the system 100, or its functions described herein, may be implemented by the processor 125. For example, the controller 105 may be hardware, firmware, or software, or any combination thereof of the system 100 that is configured to control the memory device 110. In some cases, the controller 105, or its functions described herein, may be implemented by a memory device 110. For example, the controller 105 may be hardware, firmware, or software, or some combination thereof implemented by the local memory controller 160. Similarly, in some cases, one or more functions ascribed herein to the local memory controller 160 may in some cases be performed by the controller 105 (either separate or as included in the processor 125). In some cases, the controller 105 may be distributed across the processor 125 and the memory device 110 such that portions of the controller 105 are implemented by the processor 125 and other portions are implemented by a local memory controller 160.

The components of the system 100 may exchange information with the memory device 110 using a plurality of channels 115. In some examples, the channels 115 may enable communications between the controller 105 and the memory device 110. Each channel 115 may include one or more signal paths or transmission mediums (e.g., conductors) between terminals associated with the components of system 100. For example, a channel 115 may include a first terminal that may include one or more pins or pads at controller 105 and a second terminal that may include one or more pins or pads at the memory device 110. A pin may be an example of a conductive input or output point of a device of the system 100. A pin may be configured to act as part of a channel. In some cases, a pin or pad of a terminal may correspond to a signal path of the channel 115. Additional signal paths may be coupled with a terminal of a channel for routing signals within a component of the system 100. For example, the memory device 110 may include signal paths that route a signal from a terminal of a channel 115 to the various components of the memory device (e.g., memory cells).

Some channels 115 may be dedicated to communicating specific types of information. In some cases, the channels 115 may include one or more command and address (CA) channels 170. The CA channels 170 may be configured to communicate commands between the controller 105 and the memory device 110 including control information associated with the commands (e.g., address information). For example, the CA channel 170 may communicate a read command to the memory device 110 with an address of the stored data to be read. In some cases, the CA channels 170 may be registered on a rising clock edge and/or a falling clock edge.

In some cases, the channels 115 may include one or more clock (CK) channels 175. The CK channels 175 may be configured to communicate one or more clock signals between the controller 105 and the memory device 110. The clock signal may be configured oscillate between a high state and low state and coordinate the actions of the controller 105 and the memory device 110. In some cases, the clock signal may be a differential signal and the signal paths of the CK channels 175 may be configured accordingly. In some cases, the clock signal may be single ended. The clock signal may be generated by a system clock, which may comprise one or more hardware components (e.g., oscillators, crystals, logic gates, transistors, or the like).

In some cases, the channels 115 may include one or more data (DQ) channels 180. The data channels 180 may be configured to communicate data and/or control information between the controller 105 and the memory device 110. For example, the data channels 180 may communicate information to be written to the memory device 110 or information read from the memory device 110. The data channels 180 may communicate signals that may be modulated using a variety of different modulation schemes (e.g., NRZ, PAM4, etc.). In some cases, a data channel 180 may be x4 (e.g., including four signal paths), x8 (e.g., including eight signal paths), x16 (including sixteen signal paths), etc.

In some cases, the channels 115 may include one or more other channels 185 that may be dedicated to other purposes. Examples of other channels may include write clock channels, error detection code channels, or combinations thereof.

The channels 115 may couple the controller 105 with the memory device 110 using a variety of different architectures. Examples of the various architectures of the channels 115 may include a bus, a point-to-point connection, a crossbar, a high-density interposer such as a silicon interposer, or channels formed in an organic substrate or some combination thereof. For example, in some cases, at least a portion of a signal path may be formed using a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
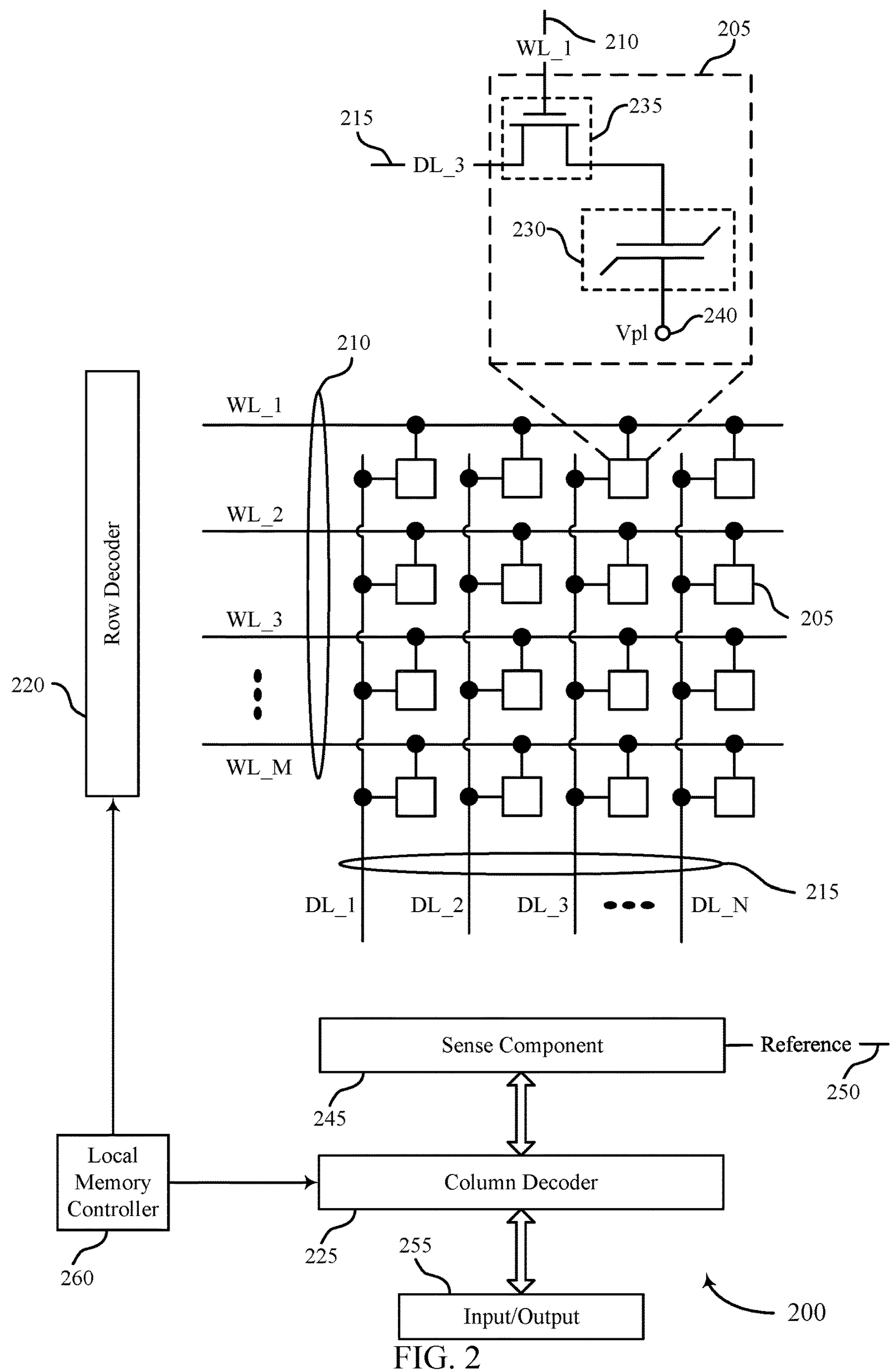
FIGS. 2 and 3 illustrate example circuits that support leakage current reduction in electronic devices in accordance with examples of the present disclosure.

FIG. 2 illustrates an example of a memory sub-array 200 in accordance with various examples of the present disclosure. The memory sub-array 200 may be an example of at least a portion of the memory dies described with reference to FIG. 1. In some cases, the memory sub-array 200 may be referred to as a memory die, memory chip, a memory device, or an electronic memory apparatus. For example, a memory device such as a memory chip may include multiple instances of memory sub-array 200, with additional row, address, bank, or bank group decoding used to select one or more sub-arrays from the multiple instances for access operations. The memory sub-array 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line or configuring a multiplexer to map the line to a given signal.

The memory sub-array 200 may include the access lines (e.g., the word lines 210 and the digit lines 215) arranged in a grid-like pattern. Memory cells 205 may be positioned at intersections of the word lines 210 and the digit lines 215. By biasing a word line 210 (e.g., applying a voltage to the word line 210), a memory cell 205 may be accessed via the digit line 215 at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may select a digit line 215 based on the received column address. For example, the memory sub-array 200 may include multiple word lines 210, labeled WL_1 through WL_M, and multiple digit lines 215, labeled DL_1 through DL_N, where M and N depend on the size of the memory array. Thus, by activating a word line 210, e.g., WL_1, the memory cells 205 in a given row may be accessed. The digit lines 215 (e.g., DL_1, . . . , DL_N) carry the data for writing or reading from the memory cells in the row. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., via charge sharing) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison.

For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include amplifiers (e.g., transistor amplifiers) to detect and amplify a difference in the signals. The detected logic state of memory cell 205 may be output through column decoder 225 as output 255. In some cases, the aspects of sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 160 described with reference to FIG. 1. In some cases, aspects of the row decoder 220, column decoder 225, or sense component 245 may be co-located with the local memory controller 260. The local memory controller 260 may be configured to receive commands and/or data from an external memory controller 105 (or a device memory controller described with reference to FIG. 1), translate the commands and/or data into information that can be used by the memory sub-array 200, perform one or more operations on the memory sub-array 200, and communicate data from the memory sub-array 200 to the external memory controller 105 (or the device memory controller) in response to performing the one or more operations.

The local memory controller 260 may generate row and column address signals to activate the target word line 210 and select the target digit line 215. The local memory controller 260 may also generate and control various voltages or currents used during the operation of the memory sub-array 200. In general, the amplitude, shape, or duration of an applied voltage or current discussed herein may be adjusted or varied and may be different for the various operations discussed in operating the memory sub-array 200.

In some cases, the local memory controller 260 may be configured to perform a write operation (e.g., a programming operation) on one or more memory cells 205 of the memory sub-array 200. During a write operation, a memory cell 205 of the memory sub-array 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 (e.g., applying a voltage to the word line 210), to access a row including the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory sub-array 200. During a read operation, the logic state stored in a memory cell 205 of the memory sub-array 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 (e.g., applying a voltage to the word line 210), to access a row including the target memory cell 205.

The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller) as part of the read operation (e.g., by selecting data read from digit lines 215 using column decoder 225).

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

One or more aspects of memory sub-array 200 may include transistors configured in accordance with the techniques described herein. For example, one or more of row decoder 220, column decoder 225, sense component 245, local memory controller 260 may include transistors configured in accordance with the techniques described herein. As another example, a switching component 235 of one or more memory cells 205 may comprise one or more transistors configured in accordance with the techniques described herein.

Figure 3:
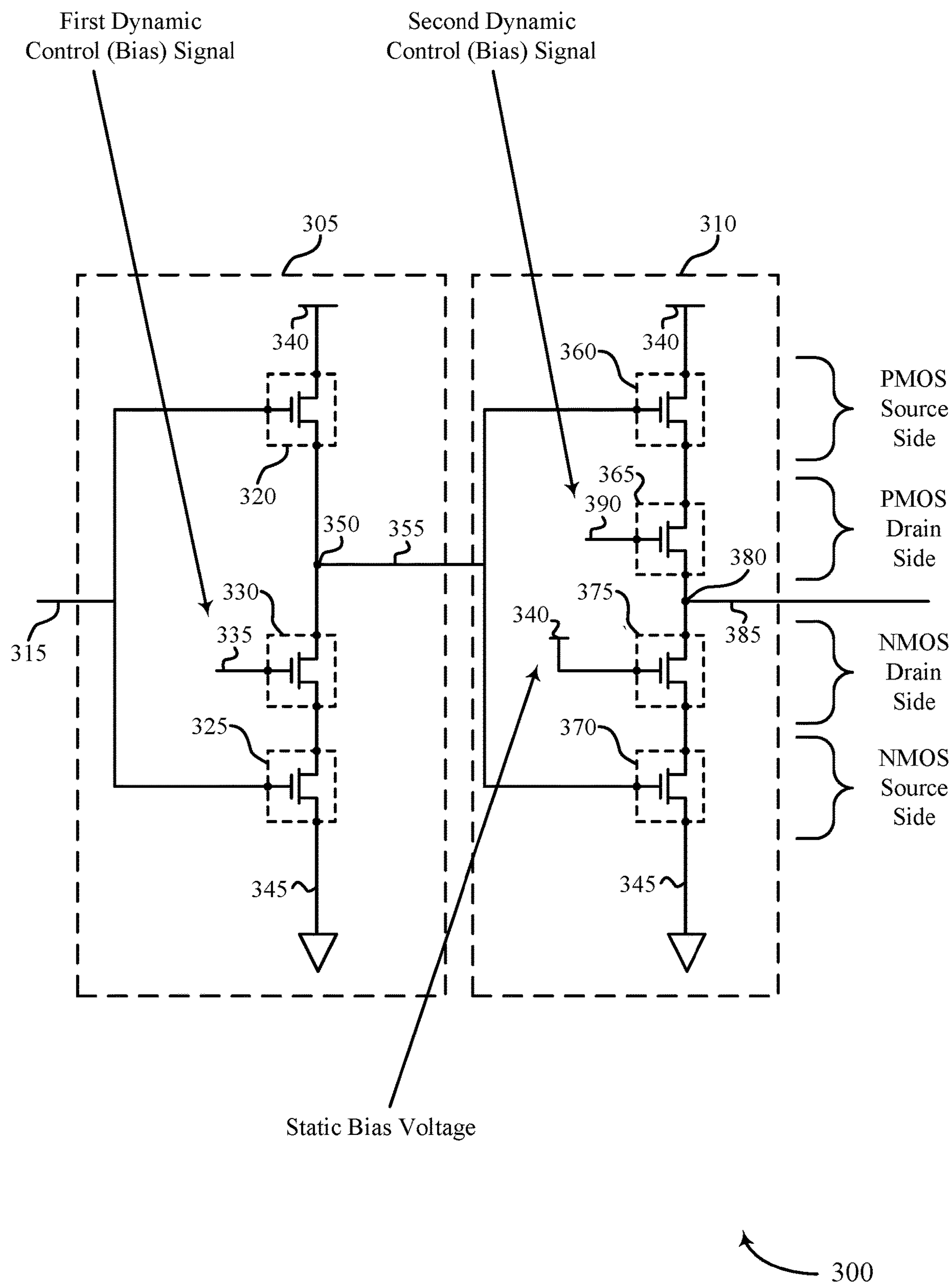

FIG. 3 illustrates an example of a circuit 300 in accordance with various examples of the present disclosure. The circuit 300 may include an inverter 305 (e.g., a first inverter) coupled with an inverter 310 (e.g., a second inverter). The inverter 305 or the inverter 310 may be included in aspects of system 100 and/or memory sub-array 200 as described with reference to FIGS. 1 and 2, or features of the inverter 305 or the inverter 310 or techniques described in the context thereof may be included in aspects of system 100 and/or memory sub-array 200 as described with reference to FIGS. 1 and 2. In some examples, the circuit 300 may include a plurality of inverters coupled together in series—though the example of circuit 300 shows two inverters coupled in series, any number of inverters may be coupled in series.

The inverter 305 may include a transistor 320 (e.g., a first transistor), a transistor 325 (e.g., a second transistor), and a transistor 330 (e.g., a third transistor). The transistor 320 and the transistor 330 may be NMOS transistors, and the transistor 320 may be a PMOS transistor. A source of the transistor 320 may be coupled with a voltage source 340 (e.g., a first voltage source), which may be a static supply voltage and may be referred to as VCCP. A source of the transistor 325 may be coupled with a voltage source 345 (e.g., a second voltage source), which may be a static supply voltage with a voltage lower than that of the voltage source 340 and may be referred to as VSS. In some examples, the transistor 320 and/or the transistor 325 may include a bulk connection (not shown), which may be biased at a static voltage. A gate of the transistor 330 may be coupled with a control signal 335 (e.g., PDNf), which may be a first dynamic control (bias) signal, and its source may be coupled with a drain of the transistor 325.

The NMOS side of the inverter 305 may include a cascode arrangement comprising the transistor 325 and the transistor 330, and the transistor 325 may be an NMOS source-side transistor and the transistor 330 may be an NMOS drain-side transistor within the cascode arrangement. Because the control signal 335 may be adjusted (e.g., adjusted dynamically), leakage current through the cascode arrangement (e.g., ISUB and GIDL) may be mitigated during, for example, a standby mode of the inverter 305 or device that includes the inverter 305. Additionally or alternatively, the transistor 325 may have a higher Vth than one or more other transistors (e.g., relative to the transistor 330). Increasing the Vth of transistor 325 may reduce leakage current (e.g., ISUB) through transistors 325 and 330.

In some examples, the inverter 305 may be or may be referred to as a first inverter. The inverter may include transistor 320 and transistor 325, which may be coupled with an input line 315. The input line 315 may be coupled with one or more components of an integrated circuit (not shown). For example, the input line 315 may be coupled with a memory cell (e.g., a memory cell 205 as described with reference to FIG. 2) and may receive an input signal associated with a logic state of the memory cell (e.g., a logic "1"). As another example, the input line 315 may be coupled with, provided by, or otherwise controlled (e.g., activated) by a memory controller (e.g., local memory controller 260). In some examples, the input line 315 may be coupled with a gate of the transistor 320 and a gate of the transistor 325. Thus, the gate voltage (e.g., Vg) of the transistor 320 and the gate voltage of the transistor 325 may be equal to or otherwise based on the voltage of the input line 315. For example, a voltage of the input line 315 may be higher if the input signal were associated with a logic "1" than if the input signal were associated with a logic "0".

In some examples, the transistor 320 may be coupled with a voltage source 340 (e.g., a first voltage source; VCCP). For example, a source of the transistor 320 may be coupled with the voltage source 340 such that the transistor 320 may be activated (e.g., it may be turned "on") based on a value of the voltage applied to the source of the transistor 320 (e.g., from the voltage source 340) and a value applied to the gate of the transistor 320 (e.g., from the input line 315).

In some examples, the transistor 325 may be coupled with a voltage source 345 (e.g., a second voltage source; VSS). For example, a source of the transistor 325 may be coupled with the voltage source 345 such that the transistor 325 may be activated (e.g., it may be turned "on") based on a value of the voltage applied to the source of the transistor 325 (e.g., from the voltage source 345) and a value applied to the gate of the transistor 325 (e.g., from the input line 315).

In some examples, the transistor 330 may be coupled with a control signal 335. The control signal 335 may be provided by a dynamic control line and may be configured to provide an adjustable (e.g., a dynamic) control (bias) signal to the transistor 330. As described herein, one or more transistors may be susceptible to certain leakage currents (e.g., ISUB and/or GIDL) during particular operating modes. For example, during a standby mode of the inverter 305 or a device that includes the inverter 305, the voltage of input line 315 may be "low" (e.g., equal to the voltage of the voltage source 345) such that transistors 325 and 330 are in an off state, and it may be beneficial to reduce an amount of leakage current through the transistors 325 and 330.

In some cases, adjusting the voltage of the control signal 335 (e.g., by a memory controller or other control component or circuitry) based on entering the standby mode may mitigate leakage current through the transistors 325 and 330. More specifically, if the transistor 330 comprises an NMOS-type transistor, leakage may occur when the gate voltage (e.g., Vg) is less than the drain voltage (e.g., Vd). For example, a larger difference between Vg and Vd may result in greater leakage current received at node 350. By adjusting (e.g., decreasing) the gate voltage Vg of the transistor 330, the difference between Vg and Vd may be lessened and, in turn, the amount of GIDL at the node 350 may be mitigated.

For example, during an active mode of the inverter 305 or a device that includes the inverter 305, the input signal 315 may be active (e.g., toggling or otherwise varying in voltage). The input signal may be activated by a control component (e.g., a memory controller or other control circuitry) during the active mode. During a standby mode of the inverter 305 or a device that includes the inverter 305, the input signal 315 may be inactive (e.g., static in voltage, such as maintained at a voltage equal to the voltage source 345). The input signal may be deactivated by the control component (e.g., the memory controller or other control circuitry) based at least in part on the inverter 305 or the device that includes the inverter 305 entering standby mode and may remain deactivated throughout the standby mode.

During the active mode, the control signal 335 may have a higher voltage (e.g., equal to the voltage of voltage source 340) than during the standby mode (e.g., a voltage equal to the voltage of voltage source 340 or a voltage between the voltage of voltage source 345 and the voltage of voltage source 340. Thus, the voltage of the control signal and thus the voltage of the gate of the transistor 330 may be reduced during the standby mode, which may cause a reduction in the voltage of the source of the transistor 330 and therefore a reduction in the voltage of the drain of the transistor 325. Reducing the voltage of the drain of the transistor 325 may reduce leakage current (e.g., GIDL and ISUB) through the transistors 325 and 330. In some cases, where the voltage of the control signal 335 is between the voltage of voltage source 345 and the voltage of voltage source 340, the control signal 335 may have a voltage swing less than a difference in voltage between the voltage source 340 and the voltage source 345.

Though increasing the Vth of transistor 325 may reduce leakage current, in some examples, high Vth transistors may occupy more space in an integrated circuit or may for some other reason be a less preferable design choice (aside from leakage current considerations) than a transistor having a relatively lower Vth. Stated another way, for example, a transistor having a relatively lower Vth may be smaller in size than a transistor having a relatively higher Vth. Although an inverter or other circuit utilizing only relatively low Vth transistors may occupy a smaller portion of an integrated circuit, low Vth transistors may be more susceptible to leakage currents. Thus, a design having an optimal combination of relatively low Vth transistors and relatively high Vth transistors may be preferable. As described herein with reference to FIG. 4, the inverter 305 or another circuit in accordance with the techniques described herein may include various configurations (combinations) of low Vth and high Vth transistors to reduce leakage current (e.g., ISUB and/or GIDL) while enhancing other design or performance characteristics (e.g., the overall size of the circuit).

As described herein, when operating in an active mode, the inverter 305 may receive an input signal via input line 315. More specifically, the input signal may be applied to a gate of the transistor 320 and the transistor 325. The input signal may be associated with, for example, a logic state of a memory cell (e.g., a memory cell 205 as described with reference to FIG. 2). As another example, the input signal may be associated with some other aspect of the operation of a memory device or other electronic device. In some examples, the inverter 305 may be in an active mode when the initial input signal is varying between a "high" value (voltage) and a "low" value (voltage). For example, when the input signal is "high", this may result in a voltage at the node 350 being "low". More specifically, a "high" voltage received via input line 315 may cause the transistor 320 to reside in an inactive (e.g., an "off") state, and may cause the transistor 325 to reside in an active (e.g., an "on") state. Thus, during an active state, the input line 315 may alternate between a "high" voltage and a "low" voltage, which may result in the node 350 alternating between a "low" voltage and "high" voltage, respectively.

In some examples, when the inverter 305 or a device that includes the inverter 305 is in an inactive mode (e.g., a standby mode), the input signal may be maintained (e.g., may be static) at the "low" voltage (e.g., the input signal is associated with a logic "0"). When the input signal received via input line 315 is "low", the transistor 320 may reside in an active (e.g., an "on") state and the transistor 325 may reside in an inactive (e.g., an "off") state. The operation of the inverter 305 is discussed in greater detail below with reference to FIG. 5.

In some examples, the transistor 320 may be a PMOS-type transistor and may be coupled with a voltage source 340 (e.g., VCCP). Because VCCP may be a greater voltage than a voltage applied to the gate of the transistor 320 when the input signal 315 is low, the transistor 320 may be activated by a "low" input voltage. Conversely, for example, a "high" input voltage applied to the gate of the transistor 320 may be a higher (e.g., a greater) voltage than VCCP, thus nominally disabling the transistor 320.

Additionally or alternatively, the transistor 325 may be an NMOS-type transistor and may be coupled with a voltage source 345 (e.g., VSS). Because a "high" input voltage applied to the gate of the transistor 320 may be a greater voltage than VSS, this may activate the transistor 320. Conversely, for example, a "low" input voltage applied to the gate of the transistor 325 may be equal to or less than VSS, thus nominally disabling the transistor 320.

In some examples, when an input signal received via input line 315 is "low", the output of the inverter 305 may be "high". For example, output line 355 may apply a relatively "high" voltage to the inverter 310. As described herein, the inverter 310 may be or may be referred to as a second inverter. The inverter 310 may include transistor 360 and transistor 370, which may be coupled with the output line 355 (e.g., the output line from the inverter 305). In some examples, the output line 355 may be coupled with a gate of the transistor 360 and a gate of the transistor 370. Thus, the gate voltage (e.g., Vg) of the transistor 360 and the transistor 370 may be inversely associated with a voltage value applied to the inverter 305 via the input line 315. The transistor 360 may be a PMOS source-side transistor and may be coupled with transistor 365 in a cascode arrangement in which transistor 365 is a PMOS drain-side transistor. The transistor 370 may be an NMOS source-side transistor and may be coupled with transistor 375 in a cascode arrangement in which transistor 375 is an NMOS drain-side transistor.

In some examples, the transistor 360 may be coupled with a voltage source 340 (e.g., a first voltage source; VCCP). For example, a source of the transistor 360 may be coupled with the voltage source 340 such that the transistor 360 may be activated (e.g., it may be turned "on") based on a value of the voltage applied to the source of the transistor 360 (e.g., from the voltage source 340) and a value applied to the gate of the transistor 360 (e.g., from the output line 355).

In some examples, the transistor 370 may be coupled with a voltage source 345 (e.g., a second voltage source; VSS). For example, a source of the transistor 370 may be coupled with the voltage source 345 such that the transistor 370 may be activated (e.g., it may be turned "on") based on a value of the voltage applied to the source of the transistor 370 (e.g., from the voltage source 345) and a value applied to the gate of the transistor 370 (e.g., from the output line 355).

In some examples, the transistor 365 may be coupled with a control signal 390 (e.g., a second control line; PDN), which may be a second dynamic control (bias) signal. The control signal 390 may be or may be referred to as a dynamic control line and may be configured to provide an adjustable (e.g., a dynamic) control (bias) signal to the transistor 365. In some examples, the control signal 390 may be complimentary to the control signal 335. Stated another way, the control signal 390 may be inverted relative to the control signal 335. In some cases, the control signal 390 may be inverted and shifted relative to the control signal 335—e.g., may be low when the control signal 335 is high and vice versa, and may have different common mode voltage that the control signal 335.

When the second inverter 310 or a device that includes the second inverter 310 is in standby mode, the voltage of the control signal 390 may be higher than when the second inverter 310 or the device that includes the second inverter 310 is in active mode. Increasing the voltage of the control signal 390 and thus of the gate of the transistor 365 during standby mode may raise the voltage of the source of the transistor 365 and therefore of the drain of the transistor 360 during standby mode. Accordingly, biasing the gate of the transistor 365 with the control signal 390 and increasing the voltage of the control signal 390 during standby mode may reduce leakage current (e.g., GIDL or ISUB) through the transistors 360 and 365.

In some cases, the transistor 360 may have a relatively high Vth (e.g., relative to one or more other transistors in second inverter 310 or the device that includes the second inverter 310). For example, the transistor 360 may have a relatively high Vth compared to the transistor 365. Increasing the Vth of the transistor 360 may reduce leakage current (e.g., ISUB) through the transistors 360 and 365.

In some cases, a gate of the transistor 375 may be biased using a static bias voltage, such as the voltage source 340. In some cases, biasing the gate of the transistor 375 with a static bias voltage may be based on the transistor 370 and thus the cascode configuration that includes the transistor 375 being configured to be on (at least in terms of terminal voltages) during standby mode, such that the PMOS cascode configuration that includes the transistor 360 is responsible for minimizing leakage current through the second inverter 310. Similarly, in some cases, the transistor 320 in the first inverter 305 may not be configured as part of a cascode arrangement based on the transistor 320 being configured to be on (at least in terms of terminal voltages) during standby mode, such that the NMOS cascode configuration that includes the transistor 325 is responsible for minimizing leakage current through the first inverter 305.

In some examples, the inverter 310 may output an inverted signal based on a value of the signal received via output line 355. For example, if the signal received via output line 355 is "low" then output line 385 may output a "high" signal. In some examples (not shown) the output line 385 may be coupled with an additional inverter that may operate in a same or similar manner as the inverter 305, which may in turn be coupled with an additional inverter that may operate in a same or similar manner as the inverter 310—any number of such converts may be coupled together in series.

FIG. 4 illustrates an example of a table 400 depicting example transistor types implemented in a circuit that supports leakage current reduction in electronic devices in accordance with aspects of the present disclosure, using the circuit 300 of FIG. 3 as an example. The table 400 may illustrate various configurations and transistor types that may be implemented in a circuit (e.g., a circuit 300 as described with reference to FIG. 3). In some examples, the table 400 may illustrate various transistor types that may be selected as a matter of design choice. The transistors shown in FIG. 4 may correspond to, for example, transistor 320, transistor 325, transistor 330, transistor 360, transistor 365, transistor 370, and transistor 375 as described herein with reference to FIG. 3.

As described with reference to FIG. 3, transistor 320, transistor 360, and transistor 365 may each be a PMOS-type transistor. Additionally or alternatively, transistor 325, transistor 330, transistor 370, and transistor 375 may each be an NMOS-type transistor.

As used herein, the term "high voltage threshold transistor" or "high Vth transistor" may refer to a transistor having an increased gate-to-source voltage (e.g., Vgs) needed to create a conductive path between the source and drain terminals. Additionally or alternatively, the term "low voltage threshold transistor" or "low Vth transistor" may refer to a transistor having a decreased gate-to-source voltage (e.g., Vgs) needed to create a conductive path between the source and drain terminals. A high Vth transistor may, for example, decrease leakage current associated with an inactive transistor (e.g., due to source-to-drain leakage). A low Vth transistor may, for example, occupy less space (area) and/or have a faster switching speed (smaller propagation delay) than a high Vth transistor (e.g., in an integrated circuit) and may therefore be a preferable design choice in some cases.

A first configuration 405 is described. In some examples, a first inverter (e.g., inverter 305 as described with reference to FIG. 3) may include transistor 320, transistor 325, and transistor 330, and a second inverter (e.g., inverter 310 as described with reference to FIG. 3) may include transistor 360, transistor 365, transistor 370, and transistor 375. In some examples, the transistor 320 and the transistor 325 of the first inverter may be high Vth transistors, and the transistor 330 may be a low Vth transistor. As described with reference to FIG. 3, either the transistor 320 or the transistor 325 may be inactive when the inverter operates in an inactive mode, depending on whether the voltage of the input signal is high or low during the inactive (standby) mode. Accordingly, selecting high Vth transistors for both the transistor 320 and the transistor 325—the source-side transistors within the respective cascode arrangements—may mitigate leakage current during the standby mode.

In some examples, the transistor 360 and the transistor 370 of the second inverter may be high Vth transistors, and the transistor 365 and the transistor 375 may be low Vth transistors. As described with reference to FIG. 3, either the transistor 360 or the transistor 370 may be inactive when the second inverter operates in an inactive mode, depending on whether the voltage of the input signal is high or low during the inactive (standby) mode. Accordingly, selecting high Vth transistors for both the transistor 360 and the transistor 370—the source-side transistors within the respective cascode arrangements—may mitigate leakage current during the standby mode.

A second configuration 410 is described. In a second configuration, one or more transistors configured to be in an on state (at least in terms of the voltages at the transistor terminals) may be changed, relative to the first configuration 405, to be low Vth transistors as such transistors may not be involved in reducing leakage current during standby mode and thus area savings or other benefits that may be associated with low Vth transistors may be desired. Accordingly, transistor 320 and transistor 370 may be switched from high Vth transistors in the first configuration 405 to low Vth transistors in the second configuration 410.

Conversely, the transistor 325 may remain a high Vth transistor in the second configuration 410 to help minimize leakage current associated with the inverter 305 and transistor 360 may remain a high Vth transistor in the second configuration 410 to help minimize leakage current associated with the inverter 310.

In some cases, based on a fabrication process, a first type of transistor (e.g., a PMOS-type transistor) may have a first propagation delay (switching speed) and a second type of transistor (e.g., an NMOS-type transistor) may have a second propagation delay (switching speed). A propagation delay may refer to, for example, the time for a current through a transistor (e.g., from the drain to the source) to change in response to a change in gate voltage. Some fabrication processes may result in NMOS transistors having smaller propagation delays than PMOS transistors, with other parameters held constant. Other fabrication processes may result in PMOS transistors having smaller propagation delays than NMOS transistors, with other parameters held constant. Additionally or alternatively, high Vth transistors and low Vth transistors may be associated with different operating speeds (propagation delays). For example, a low Vth transistor may operate faster than a high Vth transistor, with other parameters held constant.

The third configuration 415 may be associated with a fabrication process in which, with other parameters held constant, NMOS transistors have a larger propagation delay than PMOS transistors. Accordingly, all NMOS transistors in the third configuration 415 may be low Vth transistors, so as to offset the larger inherent propagation delay of the NMOS transistors, while the PMOS transistors in the third configuration 415 may be the same as in the first configuration 405.

The fourth configuration 420 may be associated with a fabrication process in which, with other parameters held constant, PMOS transistors have a larger propagation delay than NMOS transistors. Accordingly, all PMOS transistors may be low Vth transistors, so as to offset the larger inherent propagation delay of the PMOS transistors, while the NMOS transistors in the third configuration 415 may be the same as in the first configuration 405.

Figure 5:
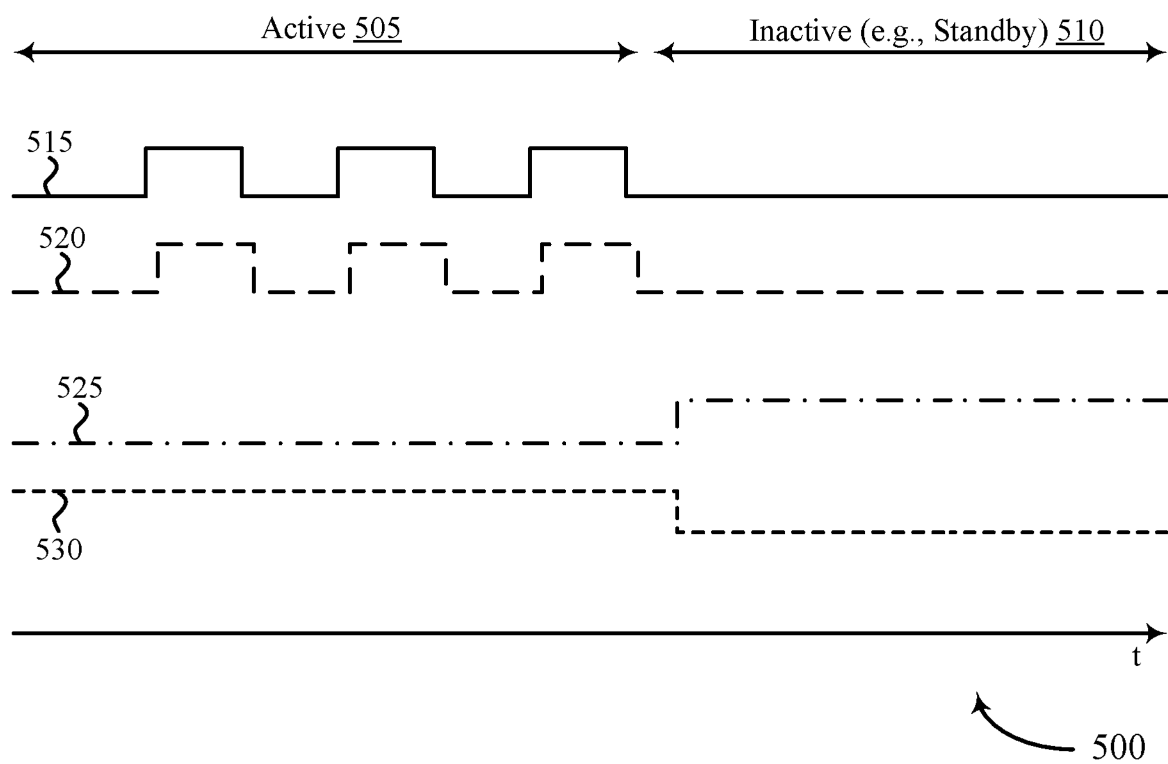
FIG. 5 illustrates an example timing diagram of operating a circuit that supports leakage current reduction in electronic devices in accordance with aspects of the present disclosure.

FIG. 5 illustrates a timing diagram 500 in accordance with various examples of the present disclosure. The timing diagram 500 may illustrate one or more operations of a circuit (e.g., an inverter) that supports leakage current reduction in electronic devices. For example, the timing diagram 500 may illustrate an input signal 515 (e.g., a signal received via input line 315 as described with reference to FIG. 3), an output signal 520 (e.g., a signal output via output line 385 as described with reference to FIG. 3), a control signal 525 (e.g., a control signal 390 as described with reference to FIG. 3), and a control signal 530 (e.g., a control signal 335 as described with reference to FIG. 3). In some examples, the timing diagram 500 may illustrate operations of one or more inverters during an active mode 505 and an inactive (e.g., a standby) mode 510.

As described herein, during an active mode 505 an inverter may receive an input signal 515 and output an output signal 520. The output signal 520 may be, for example, delayed relative to the input signal 515. Changes in the output signal 520 (e.g., rising or falling edges of the output signal 520) may be delayed relative to corresponding changes in the input signal 515 (e.g., rising or falling edges of the input signal 515), as in some cases multiple inverters (e.g., inverter 305 and inverter 310 as described with reference to FIG. 3) may be coupled together to introduce a time delay in an integrated circuit.

For example, with reference to FIG. 3, the inverter 305 may receive an input signal via input line 315 that is "high". Subsequently (with some non-zero amount of delay), the inverter 305 may output a signal (via output line 355) that is an inverse of the input signal (e.g., a "low" signal). The inverter 310 may receive the "low" signal as an input and may subsequently (with some non-zero amount of delay) output a signal (via output line 385) that is an inverse of the received signal (e.g., a "high" signal). Accordingly, the signal received at inverter 305 and output by inverter 310 may be a same or similar signal—a "high" signal—but may be delayed by a time associated with the operations of inverter 305 and inverter 310.

Accordingly, during active mode 505, input signal 515 may represent a signal received by a first inverter (e.g., inverter 305) and output signal 520 may represent a signal output by a subsequent inverter (e.g., inverter 310). The input signal 515 and output signal 520 may be a same or a similar signal (e.g., a "signal" and/or a "low" signal) delayed in time. In some examples, as described herein, during the active mode 505 a control signal may be applied to each of the inverters. For example, the control signal 530 may be applied to a first inverter (e.g., inverter 305) during the active mode 505, and the control signal 525 may be applied to a second inverter (e.g., inverter 310) during the active mode 505. In some examples, the control signal 525 may be a same or similar voltage as control signal 390 as described with reference to FIG. 3 (e.g., VSS), and the control signal 530 may be a same or similar voltage as control signal 335 as described with reference to FIG. 3.

In some examples, control signals that are a same or similar voltage as VSS and VCCP, respectively, may be applied to the inverters during at least a portion of an active mode 505. For example, the control signal 525 may be at a voltage equal to VSS during at least a portion of active mode 505 (e.g., during the portion of active mode 505 immediately prior to inactive mode 510). As another example, the control signal 530 may be at a voltage equal to VCCP during at least a portion of active mode 505 (e.g., during the portion of active mode 505 immediately prior to inactive mode 510).

During inactive mode 510, a "low" signal may be applied to a first inverter (e.g., in the input signal 315 may be deactivated, maintained at a static voltage, which may correspond to VSS and/or a low logic value). As described herein, during an inactive mode 510, the inverter(s) may be susceptible to leakage current through one or more transistors (e.g., across one or more inactive transistors). The leakage current may be reduced, for example, by adjusting a voltage of the control signal 525 and/or the control signal 530. For example, the control signal 525 (e.g., PDN) may be increased to increase a gate voltage (e.g., Vg) of a transistor (e.g., transistor 365 as described with reference to FIG. 3). Additionally or alternatively, the control signal 530 (e.g., PDNf) may be decreased to decrease a gate voltage of a different transistor (e.g., transistor 330 as described with reference to FIG. 3). By increasing or decreasing a gate voltage of a respective transistors, leakage current (e.g., GIDL or ISUB) through the respective transistor may be minimized (e.g., by causing a corresponding increase or decrease in the drain voltage of a source-side transistor cascoded with the respective transistor).

In some examples, the control signal 525 (e.g., PDN) may be increased to a voltage level (e.g., VDD1) that is greater than VSS, which may reduce leakage current across the transistor. In some cases, VDD1 may be greater than VSS and also lower than VCCP, which may reduce leakage current across the transistor while utilizing less power (e.g., while utilizing a change in the control signal 525 of a lower magnitude) relative to changing the control signal 525 voltage from VSS to VCCP. Thus, the control signal 525 may have a voltage swing (difference between its maximum and minimum voltage values) that is smaller than the difference between VCCP and VSS, and applying a control signal 525 at a same or similar voltage level as VDD1 may reduce an amount of leakage current across the transistor with increased power savings.

In some examples, the control signal 530 (e.g., PDNf) may be decreased to a voltage level (e.g., VDD2) that is lower than VCCP, which may reduce leakage current across the transistor. In some cases, VDD2 may be lower than VCCP and also greater than VSS, which may reduce leakage current across the transistor while utilizing less power (e.g., while utilizing a change in the control signal 530 of a lower magnitude) relative to changing the control signal 530 voltage from VCCP to VSS. Thus, the control signal 530 may have a voltage swing (difference between its maximum and minimum voltage values) that is smaller than the difference between VCCP and VSS, and applying a control signal 530 at a same or similar voltage level as VDD2 may reduce an amount of leakage current across the transistor with increased power savings.

Figure 6:
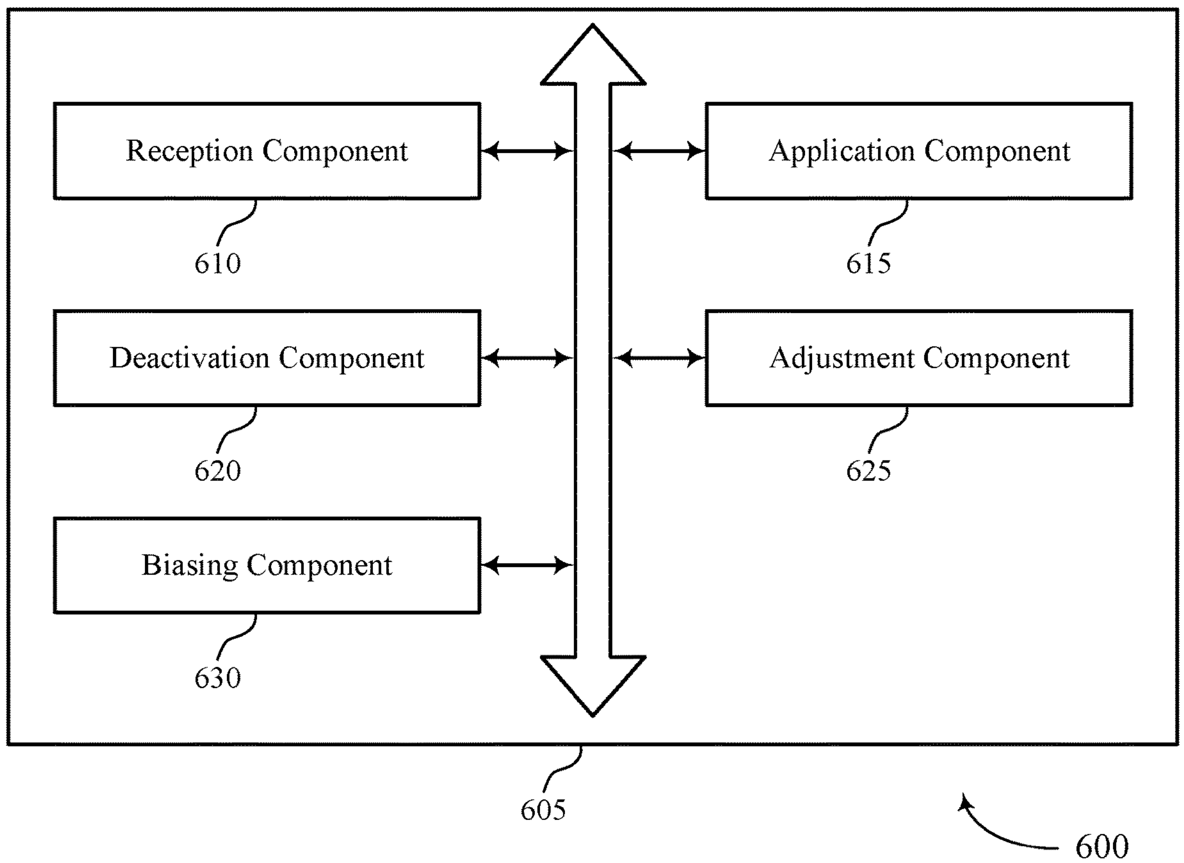
FIG. 6 illustrates a block diagram of a device that supports leakage current reduction in electronic devices in accordance with aspects of the present disclosure.

FIG. 6 shows a block diagram 600 of a device 605 that supports leakage current reduction in electronic devices in accordance with aspects of the present disclosure. The device 605 may include a reception component 610, an application component 615, a deactivation component 620, an adjustment component 625, and a biasing component 630. Each of these modules may communicate, directly or indirectly, with one another (e.g., via one or more buses).

The reception component 610 may receive an input signal at a first transistor and a second transistor. In some examples, the reception component 610 may receive an output signal at a fourth transistor and a sixth transistor.

The application component 615 may apply a dynamic control signal to a gate of a third transistor that is coupled with the second transistor in a cascode configuration. In some examples, the application component 615 may apply, prior to deactivating the input signal, a second dynamic control signal to a gate of a fifth transistor that is coupled with the fourth transistor in a cascode configuration.

The deactivation component 620 may deactivate the input signal after applying the dynamic control signal. In some examples, deactivating the input signal includes maintaining the voltage of the input signal at a constant level. In some examples, deactivating the input signal includes removing the input signal from the first transistor and the second transistor.

The adjustment component 625 may adjust a voltage of the dynamic control signal based on deactivating the input signal. In some examples, the adjustment component 625 may adjust a voltage of the second dynamic control signal based on deactivating the input signal.

The biasing component 630 may bias a source of the first transistor to a first voltage that is greater than a maximum voltage of the dynamic control signal. In some cases, biasing a source of the second transistor to a second voltage, where adjusting the voltage of the dynamic control signal includes adjusting the voltage of the dynamic control signal by an amount less than a difference between the voltage and the second voltage.

Figure 7:
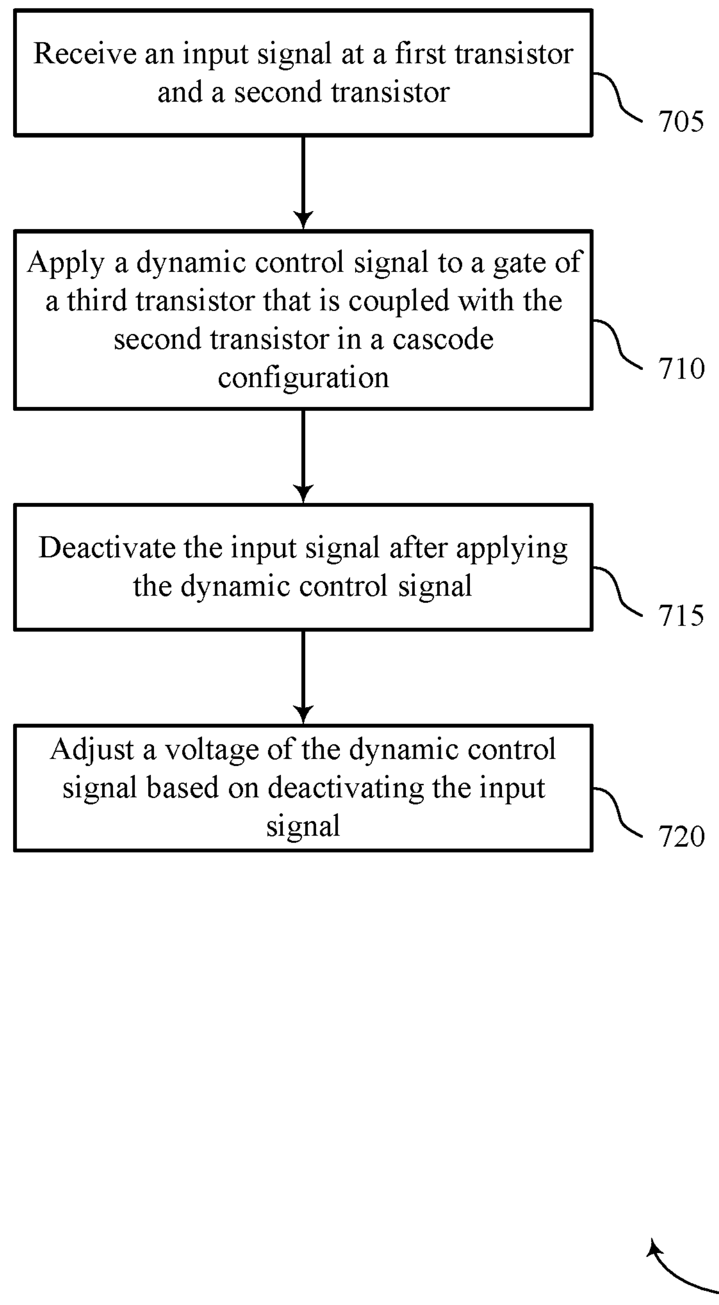
FIGS. 7 through 9 show flowcharts illustrating methods that support leakage current reduction in electronic devices in accordance with aspects of the present disclosure.

FIG. 7 shows a flowchart illustrating a method 700 that supports leakage current reduction in electronic devices in accordance with aspects of the present disclosure. The operations of method 700 may be implemented by a memory controller or its components as described herein. For example, the operations of method 700 may be performed by a one or more components as described with reference to FIG. 6. In some examples, a memory controller may execute a set of instructions to control the functional elements of the memory device to perform the functions described below. Additionally or alternatively, a memory device may perform aspects of the functions described below using special-purpose hardware.

At 705, the memory device may receive an input signal at a first transistor and a second transistor. The operations of 705 may be performed according to the methods described herein. In some examples, aspects of the operations of 705 may be performed by a reception component as described with reference to FIG. 6.

At 710, the memory device may apply a dynamic control signal to a gate of a third transistor that is coupled with the second transistor in a cascode configuration. The operations of 710 may be performed according to the methods described herein. In some examples, aspects of the operations of 710 may be performed by an application component as described with reference to FIG. 6.

At 715, the memory device may deactivate the input signal after applying the dynamic control signal. The operations of 715 may be performed according to the methods described herein. In some examples, aspects of the operations of 715 may be performed by a deactivation component as described with reference to FIG. 6.

At 720, the memory device may adjust a voltage of the dynamic control signal based on deactivating the input signal. The operations of 720 may be performed according to the methods described herein. In some examples, aspects of the operations of 720 may be performed by an adjustment component as described with reference to FIG. 6.

In some examples, an apparatus as described herein may perform a method or methods, such as method 700. The apparatus may include features, means, or instructions (e.g., a non-transitory computer-readable medium storing instructions executable by a processor) for receiving an input signal at a first transistor and a second transistor, applying a dynamic control signal to a gate of a third transistor that is coupled with the second transistor in a cascode configuration, deactivating the input signal after applying the dynamic control signal, and adjusting a voltage of the dynamic control signal based at least in part on deactivating the input signal.

Some examples of the methods, apparatuses, and non-transitory computer-readable medium described herein may further include operations, features, means, or instructions for biasing a source of the second transistor to a second voltage. In some examples of the methods, apparatuses, and non-transitory computer-readable medium described herein, adjusting the voltage of the dynamic control signal may include adjusting the voltage of the dynamic control signal by an amount less than a difference between the voltage and the second voltage.

Some examples of the methods, apparatuses, and non-transitory computer-readable medium described herein may further include operations, features, means, or instructions for biasing a source of the first transistor to a first voltage that is greater than a maximum voltage of the dynamic control signal.

In some examples of the methods, apparatuses, and non-transitory computer-readable medium described herein, deactivating the input signal comprises maintaining the voltage of the input signal at a constant level. In some examples of the methods, apparatuses, and non-transitory computer-readable medium described herein, deactivating the input signal comprises removing the input signal from the first transistor and the second transistor.

Some examples of the methods, apparatuses, and non-transitory computer-readable medium described herein may further include operations, features, means, or instructions for receiving an output signal at a fourth transistor and a sixth transistor, applying, prior to deactivating the input signal, a second dynamic control signal to a gate of a fifth transistor that is coupled with the fourth transistor in a cascode configuration, and adjusting a voltage of the second dynamic control signal based at least in part on deactivating the input signal.

Figure 8:
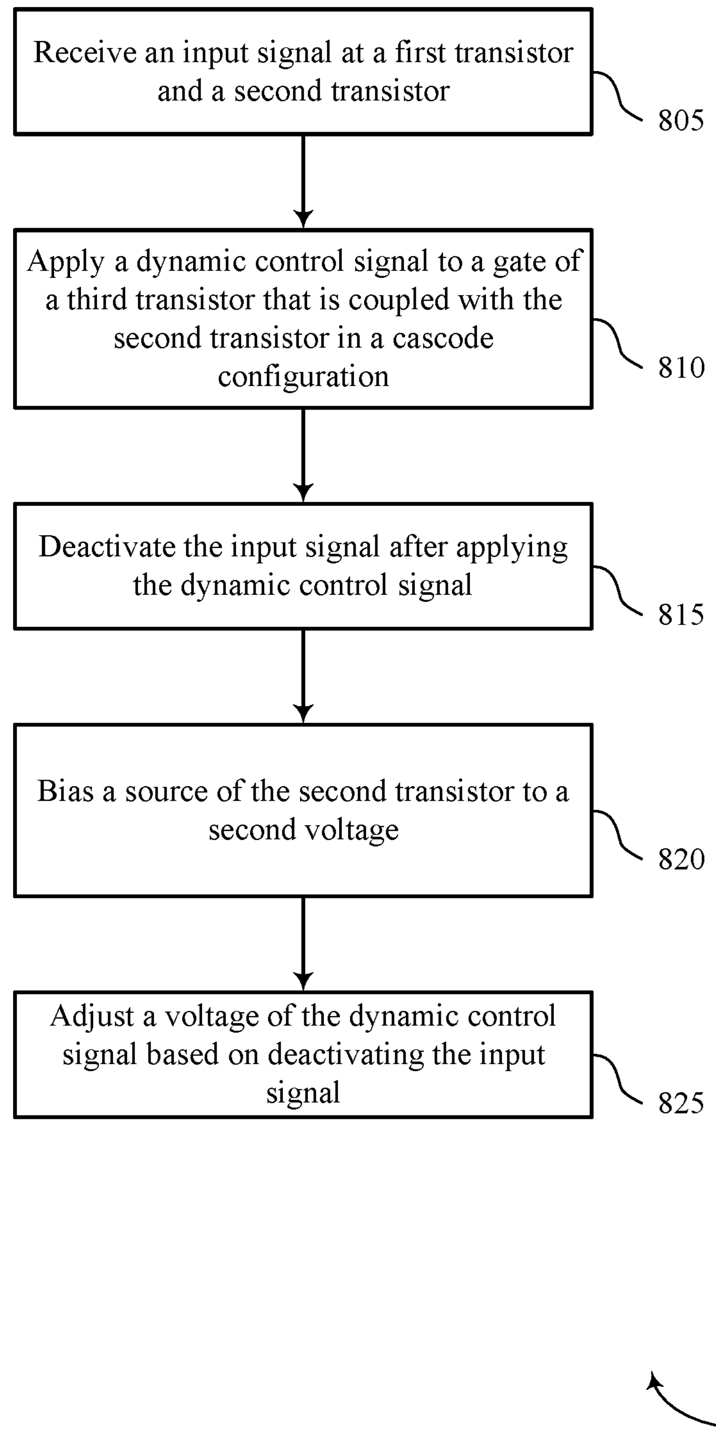

FIG. 8 shows a flowchart illustrating a method 800 that supports leakage current reduction in electronic devices in accordance with aspects of the present disclosure. The operations of method 800 may be implemented by a memory controller or its components as described herein. For example, the operations of method 800 may be performed by a one or more components as described with reference to FIG. 6. In some examples, a memory controller may execute a set of instructions to control the functional elements of the memory device to perform the functions described below. Additionally or alternatively, a memory device may perform aspects of the functions described below using special-purpose hardware.

At 805, the memory device may receive an input signal at a first transistor and a second transistor. The operations of 805 may be performed according to the methods described herein. In some examples, aspects of the operations of 805 may be performed by a reception component as described with reference to FIG. 6.

At 810, the memory device may apply a dynamic control signal to a gate of a third transistor that is coupled with the second transistor in a cascode configuration. The operations of 810 may be performed according to the methods described herein. In some examples, aspects of the operations of 810 may be performed by an application component as described with reference to FIG. 6.

At 815, the memory device may deactivate the input signal after applying the dynamic control signal. The operations of 815 may be performed according to the methods described herein. In some examples, aspects of the operations of 815 may be performed by a deactivation component as described with reference to FIG. 6.

At 820, the memory device may bias a source of the second transistor to a second voltage, where adjusting the voltage of the dynamic control signal includes. The operations of 820 may be performed according to the methods described herein. In some examples, aspects of the operations of 820 may be performed by a biasing component as described with reference to FIG. 6.

At 825, the memory device may adjust a voltage of the dynamic control signal based on deactivating the input signal. The operations of 825 may be performed according to the methods described herein. In some examples, aspects of the operations of 825 may be performed by an adjustment component as described with reference to FIG. 6.

Figure 9:
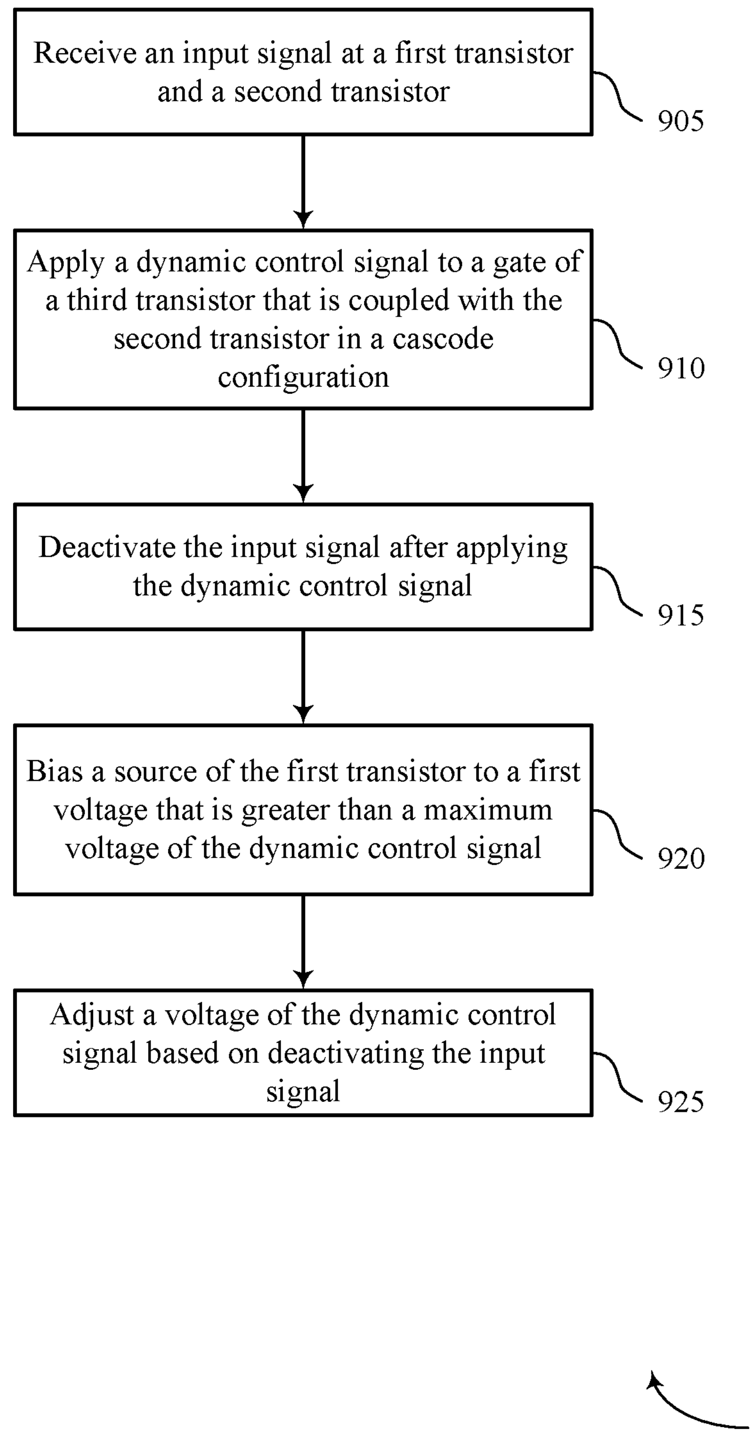

FIG. 9 shows a flowchart illustrating a method 900 that supports leakage current reduction in electronic devices in accordance with aspects of the present disclosure. The operations of method 900 may be implemented by a memory controller or its components as described herein. For example, the operations of method 900 may be performed by a one or more components as described with reference to FIG. 6. In some examples, a memory controller may execute a set of instructions to control the functional elements of the memory device to perform the functions described below. Additionally or alternatively, a memory device may perform aspects of the functions described below using special-purpose hardware.

At 905, the memory device may receive an input signal at a first transistor and a second transistor. The operations of 905 may be performed according to the methods described herein. In some examples, aspects of the operations of 905 may be performed by a reception component as described with reference to FIG. 6.

At 910, the memory device may apply a dynamic control signal to a gate of a third transistor that is coupled with the second transistor in a cascode configuration. The operations of 910 may be performed according to the methods described herein. In some examples, aspects of the operations of 910 may be performed by an application component as described with reference to FIG. 6.

At 915, the memory device may deactivate the input signal after applying the dynamic control signal. The operations of 915 may be performed according to the methods described herein. In some examples, aspects of the operations of 915 may be performed by a deactivation component as described with reference to FIG. 6.

At 920, the memory device may bias a source of the first transistor to a first voltage that is greater than a maximum voltage of the dynamic control signal. The operations of 920 may be performed according to the methods described herein. In some examples, aspects of the operations of 920 may be performed by a biasing component as described with reference to FIG. 6.

At 925, the memory device may adjust a voltage of the dynamic control signal based on deactivating the input signal. The operations of 925 may be performed according to the methods described herein. In some examples, aspects of the operations of 925 may be performed by an adjustment component as described with reference to FIG. 6.

It should be noted that the methods described above describe possible implementations, and that the operations and the steps may be rearranged or otherwise modified and that other implementations are possible. Furthermore, aspects from two or more of the methods may be combined.

In some examples, an apparatus or device may perform aspects of the functions described herein. The device may include a first transistor coupled with an input line and configured to receive an input signal from the input line, a second transistor coupled with the input line and configured to receive the input signal from the input line, and a third transistor coupled with the second transistor in a cascode configuration and configured to receive a dynamic control signal and output an output signal based at least in part on receiving the dynamic control signal.

In some examples, a source of the first transistor is configured to be biased at a first voltage that is greater than a maximum voltage of the dynamic control signal. In some examples, a source of the second transistor is configured to be biased at a second voltage, and wherein the dynamic control signal is configured to have a voltage swing that is smaller than a difference between the first voltage and the second voltage.

In some examples, the device may include an inverter that comprises the first transistor, the second transistor, and the third transistor, a fourth transistor coupled with an output line of the inverter and configured to receive the output signal from the output line, a fifth transistor coupled with the fourth transistor in a cascode configuration, wherein the fifth transistor is configured to receive a second dynamic control signal and output a second output signal based at least in part on receiving the second dynamic control signal, a sixth transistor coupled with the output line of the inverter, wherein the sixth transistor is configured to receive the output signal from the output line, and a seventh transistor coupled with the sixth transistor in a cascode configuration, wherein the seventh transistor is configured to output the second output signal based at least in part on the sixth transistor receiving the output signal.

In some examples, the device may include a second inverter that comprises the fourth transistor, the fifth transistor, the sixth transistor, and the seventh transistor. In some examples, the sixth transistor is configured to be activated when the apparatus is in a standby mode, and wherein the sixth transistor has a lower threshold voltage than the fourth transistor. In some examples, the fourth transistor has a lower threshold voltage than the sixth transistor.

In some examples, the second dynamic control signal is configured to be inverted relative to the dynamic control signal. In some examples, the device may include control circuitry configured to vary a voltage of the dynamic control signal. In some examples, the first transistor is configured to be activated when the apparatus is in a standby mode, and wherein the first transistor has a lower threshold voltage than the second transistor. In some examples, the third transistor has a lower threshold voltage than the second transistor. In some examples, the first transistor comprises a PMOS transistor, and wherein the second transistor and the third transistor each comprise an NMOS transistor.

In some examples, the first transistor comprises a first type of channel, and wherein the second transistor and the third transistor each comprise a second type of channel different than the first type of channel. In some examples, the first transistor and the second transistor each have a higher threshold voltage than the third transistor. In some examples, the first transistor has a first propagation delay and the second transistor has a second propagation delay that is larger than the first propagation delay, and wherein the second transistor has a voltage threshold that is lower than the first transistor. In some examples, the first transistor has a first propagation delay and the second transistor has a second propagation delay that is smaller than the first propagation delay, and wherein the second transistor has a voltage threshold that is higher than the first transistor.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:

receiving an input signal at a first transistor and a second transistor;

applying a control signal to a gate of a third transistor that is coupled with the second transistor;

deactivating the input signal after applying the control signal;

adjusting a voltage of the control signal based at least in part on deactivating the input signal;

receiving an output signal at a fourth transistor and a sixth transistor;

applying, prior to deactivating the input signal, a second control signal to a gate of a fifth transistor that is coupled with the fourth transistor; and adjusting a voltage of the second control signal based at least in part on deactivating the input signal.

2. The method of claim 1, further comprising:

biasing a source of the second transistor to a second voltage, wherein adjusting the voltage of the control signal comprises:

adjusting the voltage of the control signal by an amount less than a difference between the voltage and the second voltage.

3. The method of claim 1, further comprising:

biasing a source of the first transistor to a first voltage that is greater than a maximum voltage of the control signal.

4. The method of claim 1, wherein:

deactivating the input signal comprises removing the input signal from the first transistor and the second transistor.

5. An apparatus, comprising:

an inverter comprising:

a first transistor coupled with an input line and configured to receive an input signal from the input line;

a second transistor coupled with the input line and configured to receive the input signal from the input line; and a third transistor coupled with the second transistor and configured to receive a control signal and output an output signal based at least in part on receiving the control signal, wherein a source of the first transistor is configured to be biased at a first voltage that is greater than a maximum voltage of the control signal;

a fourth transistor coupled with an output line of the inverter and configured to receive the output signal from the output line;

a fifth transistor coupled with the fourth transistor, wherein the fifth transistor is configured to receive a second control signal and output a second output signal based at least in part on receiving the second control signal;

a sixth transistor coupled with the output line of the inverter, wherein the sixth transistor is configured to receive the output signal from the output line; and a seventh transistor coupled with the sixth transistor, wherein the seventh transistor is configured to output the second output signal based at least in part on the sixth transistor receiving the output signal.

6. The apparatus of claim 5, wherein a source of the second transistor is configured to be biased at a second voltage, and wherein the control signal is configured to have a voltage swing that is smaller than a difference between the first voltage and the second voltage.

7. The apparatus of claim 5, wherein the first transistor, the second transistor, the fourth transistor, and the sixth transistor have higher respective threshold voltages than each of the third transistor, the fifth transistor, and the seventh transistor.

8. The apparatus of claim 5, wherein the second transistor and the fourth transistor have higher respective threshold voltages than each of the first transistor, the third transistor, the fifth transistor, the sixth transistor, and the seventh transistor.

9. The apparatus of claim 5, wherein the first transistor and the fourth transistor have higher respective threshold voltages than each of the second transistor, the third transistor, the fifth transistor, the sixth transistor, and the seventh transistor.

10. The apparatus of claim 5, wherein the second transistor and the sixth transistor have higher respective threshold voltages than each of the first transistor, the third transistor, the fourth transistor, the fifth transistor, and the seventh transistor.

11. The apparatus of claim 5, further comprising:

a second inverter that comprises the fourth transistor, the fifth transistor, the sixth transistor, and the seventh transistor.

12. The apparatus of claim 5, wherein the second control signal is configured to be inverted relative to the control signal.

13. The apparatus of claim 5, further comprising:

control circuitry configured to vary a voltage of the control signal.

14. The apparatus of claim 5, wherein the first transistor comprises a PMOS transistor, and wherein the second transistor and the third transistor each comprise an NMOS transistor.

15. The apparatus of claim 5, wherein the first transistor comprises a first type of channel, and wherein the second transistor and the third transistor each comprise a second type of channel different than the first type of channel.

16. The apparatus of claim 5, wherein the first transistor has a first propagation delay and the second transistor has a second propagation delay that is different than the first propagation delay.

17. An apparatus, comprising:

a first inverter, comprising:

a first transistor coupled with an input line and configured to have a source biased at a first voltage;

a second transistor coupled with the input line and configured to have a source biased at a second voltage; and a third transistor coupled with the second transistor;

a second inverter, comprising:

a fourth transistor coupled with an output line of the first inverter and configured to have a source biased at the first voltage;

a fifth transistor coupled with the fourth transistor;

a sixth transistor coupled with the output line of the first inverter and configured to have a source biased at the second voltage; and a seventh transistor coupled with the sixth transistor; and a memory controller coupled with the first and second inverters and operable to cause the apparatus to:

receive an input signal at the first transistor and the second transistor via the input line;

apply a first control signal to a gate of the third transistor;

deactivate the input signal after applying the first control signal to the gate of the third transistor;

adjust a voltage of the first control signal based at least in part on deactivating the input signal;

receive an output signal at the fourth transistor and the sixth transistor via the output line of the first inverter;

apply, prior to deactivating the input signal, a second control signal to a gate of the fifth transistor; and adjust a voltage of the second control signal based at least in part on deactivating the input signal.

* * * * *